United States Patent [19]

Gontowski, Jr.

[11] 4,348,451
[45] Sep. 7, 1982

[54] METHOD FOR MAKING CUSTOM INTEGRATED CIRCUITS AND METALLIZATION ARTWORK THEREFOR

[75] Inventor: Walter S. Gontowski, Jr., Thompson, Conn.

[73] Assignee: Sprague Electric Company, North Adams, Mass.

[21] Appl. No.: 261,066

[22] Filed: May 6, 1981

[51] Int. Cl.³ .................. B32B 3/00; B05D 5/12; B32B 15/04; H01L 27/02
[52] U.S. Cl. .................. 428/203; 357/40; 357/51; 427/96; 427/272; 427/282; 428/457; 428/901
[58] Field of Search .................. 428/203, 901, 457; 427/96, 272, 282; 357/40, 51

[56] References Cited

U.S. PATENT DOCUMENTS 4,244,125  1/1981  Corey .................. 428/901 X

OTHER PUBLICATIONS

California Devices, Inc., Create Your Own Integrated Circuit.
F. E. Barrows et al., Electronics, "Photography Speeds Printed Circuit Design", pp. 102, 104, 105 (1961).
Exar, Linear and Digital Semi-Custom IC Design Programs, Mar. 1981.
Monosil, Monologic TM, A Cost-effective Way to Speed Your Custom CMOS I.C. Development Using Predesigned Gate Arrays.

Primary Examiner—Thomas J. Herbert, Jr.
Attorney, Agent, or Firm—Connolly and Hutz

[57] ABSTRACT

Integrated circuit semiconductor wafers are prepared through diffusions, depositing a protective glass layer, opening holes in the glass layer exposing component contact areas. The wafers are stored. Partially complete metallization artwork is prepared by using the normal cut-and-strip technique, whereby the interconnections between component elements are essentially unaccounted for in this artwork. A circuit design engineer completes the artwork by using opaque adhesive tape to represent the interconnections of his circuits. Besides providing practical means by which such designers may fully participate in deciding upon layout and circuit realization tradeoffs with the IC manufacturer, this invention provides a shorter faster process at lower cost than by conventional procedures.

2 Claims, 4 Drawing Figures

METHOD FOR MAKING CUSTOM INTEGRATED CIRCUITS AND METALLIZATION ARTWORK THEREFOR

BACKGROUND OF THE INVENTION

This invention relates to "custom integrated circuits" made by a method whereby standard integrated circuits, each containing an array of transistors and resistors, is made in advance and interconnections of these circuit components is thereafter made quickly to conform with a customer's special circuit specification.

In an integrated circuit, a system of metal films provide termination pads as well as interconnective means between the components that may be formed in or on a semiconductor die. Large numbers of identical integrated circuits are formed on a single crystalline semiconductor wafer by a series of process steps most of which add structure to some part of all the integrated circuits on the wafer simultaneously. Such is the case for most of the steps normally employed to form the system of interconnective and terminating metal films in each integrated circuit.

Such a system of metal films is normally deposited after forming at one surface in the wafer the diffused portions of transistors and diffused resistors. A glass layer is formed over the wafer surface. Holes are provided in the glass layer through which electrical access may be had to some or all of the elements of each transistor and to the contact areas of resistors. Aluminum is usually vacuum deposited over the glass, forming a single aluminum film over the entire wafer surface making contact through the holes in the glass with the transistors and resistors.

A photo-resist layer is applied over the single aluminum film. The photo-resist film is exposed to light in regions that are to be selectively removed, or vice versa, by a subsequent etch step so as to form the above mentioned metal patterns on each integrated circuit. This exposure to light of the photo-resist is usually accomplished by a standard sequential step-and-repeat method whereby the photo resist layer over each integrated circuit region is one at a time exposed to a pattern of light corresponding to the ultimate metal system pattern desired for each of the identical integrated circuits.

This light pattern is obtained by preparing artwork at a greatly enlarged scale, optically reducing the scale and photographing the artwork to form a photo-mask (transparency) and exposing the photo resist layer on the wafer through that photo-mask.

The artwork is typically a composite sheet consisting of an actinically opaque top film bonded lightly to a transparent temperature stable sheet, e.g. Mylar. By a standard cut-and-strip technique, the opaque film is cut so that portions of it may be peeled off and removed to form the desired pattern. Programmable machines have been developed to perform this cut-and-strip operation. Whether the cutting and stripping is done manually or by machine, a very accurate drawing of the desired pattern must be prepared by an engineering draftsman. Many man hours are usually required to make such drawings.

It is an object of this invention to provide a means by which a manufacturer may make integrated circuits to a customer's specifications on a custom service basis which method is simpler, faster and more economical.

It is a further object of this invention to provide such a method whereby a standard integrated circuit includes an array of transistors and standard but partially completed cut and strip artwork is provided which may be easily completed by the customer to avoid the need for the aforementioned draftman's attention.

SUMMARY OF THE INVENTION

Separate opaque patches of a cut-and-strip type film are adhered to a transparent sheet forming a partially completed metallization artwork, by which a metal film system for contacting the components of a principal portion of an integrated circuit may be produced by standard metallization, photolithographic and selective etch processes.

The artwork may then be completed by applying opaque strips between particular ones of the patches that correspond to those of the component elements, e.g. transistor collector, anode of a diode, end of a resistor, etc., and principal terminal pads that will be electrically connected to form the principal portion of the integrated circuit. The opaque strips may be strips of black adhesive tape. Alternatively a thick opaque ink may be drawn on the still transparent parts of the incomplete artwork.

The invention anticipates the production and storage of large numbers of semiconductor wafers each comprising an array of many essentially identical integrated circuit die. Each die includes in a major surface thereof the doped P-type and N-type elements of a group of transistors and resistors, and a glass layer overlying the major surface having holes provided in areas of each element to be contacted. These wafers may also include a film of metal having been deposited over the entire major surface and making conntact through the holes in the glass to the doped semiconductor elements.

The invention also anticipates the production and storage by an integrated circuits manufacturer of a number of the above described incomplete artworks. One may thereafter be sent to a customer who may complete the artwork, by taping or otherwise. Upon its subsequent return to the manufacturer, one or more of the stored semiconductor wafers may then be metallized in conformance with the customer completed metallization artwork. Thereafter, the individual integrated circuit die are broken apart from the wafer, packaged and provided leads by standard tooling and methods, and delivered to the customer.

Special procedures used heretofore by integrated circuit manufacturers for reducing the costs and time associated with the supply of custom circuits include the translation of customer provided requirements by a draftsman into formal drawings that are subsequently transformed to complete metallization artwork in cut-and-strip form before the actual selective metallization can proceed. The present invention makes it possible to eliminate the costly and time consuming formal drafting step in the process that follows receipt by the manufacturer of the customer's proprietary circuit information.

DESCRIPTION OF THE PREFERRED EMBODIMENT

Figure 1:
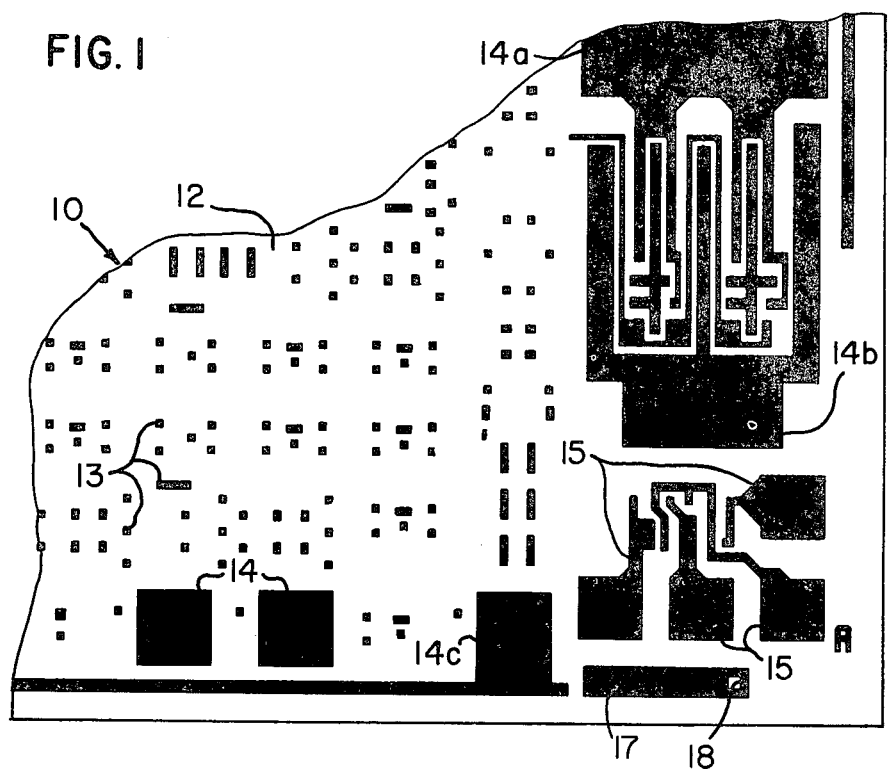
FIG. 1 shows a photograph of a broken away portion of a partially completed metallization artwork of this invention.

The artwork 10 of FIG. 1, consists of a transparent MYLAR sheet portion 12 and overlying opaque film portions 13, 14 and 15 that are shown completely black. MYLAR is a Tradename of E. I. DuPont De Nemours & Company, Wilmington, Delaware. The start material is a composite MYLAR sheet to which is bonded a film of opaque plastic film, the composite having the Tradename RUBYLITH is supplied by Dynagraf Company, Long Island City, New York. The artwork 10 is formed by cutting the opaque film and peel stripping portions of it away from sheet 12 in conformance with a draftsman's precision drawing leaving the opaque portions, e.g. 13, 14 and 15, representing metal. These opaque portions are grouped functionally as:

(1) spaced patches 13 for which corresponding metal is to make contact with elements of the principal circuit components;

(2) spaced pads 14 for which the corresponding metal is to form the spaced terminal pads to provide electrical access, e.g. by thermal compression bonding of fine gold wires, to the principal circuit portion of the integrated circuit; and (3) spaced islands 15 that correspond to a complete system of metal film islands interconnecting elements of and providing terminal pads for a test circuit portion 16. The highly efficient and greatly preferred integrated test circuit portion 16 (FIG. 2) is more fully described in the copending application Ser. No. 248,142 filed Mar. 30, 1981 which is incorporated by reference herein. Further the opaque band 17, has a hole 18 that serves as the alignment target.

The RUBYLITH artwork 10 of FIG. 1 is incomplete, there being no provision yet for the interconnecting metal between component elements of the principal circuit portion of the integrated circuit.

Figure 2:
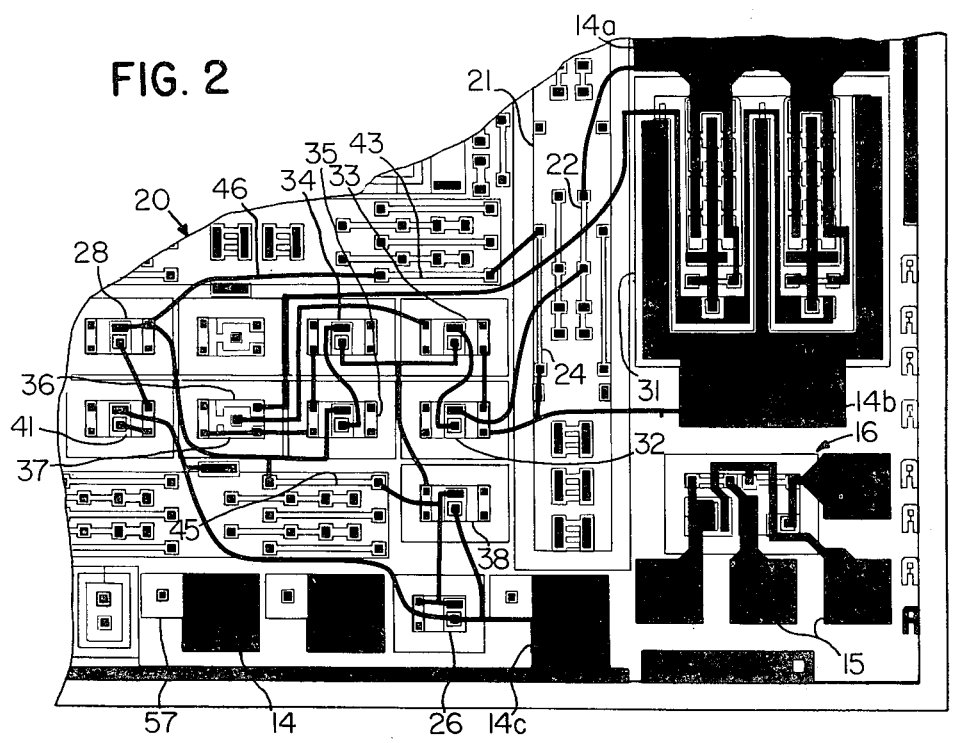
FIG. 2 shows a photograph of the metallization artwork portion of FIG. 1 having been completed and registered and superimposed over a composite outline drawing portion of the corresponding semiconductor surface including the diffused areas that represent elements, respectively of the various electrical components of the integrated circuit to be formed.

The registration of the metallization artwork 10 over a composite transparency outline drawing of component elements formed on the semiconductor die, results in a stack assembly 20 as pictured in FIG. 2.

This particular drawing represents an integrated circuit (not shown) having a P-type substrate, an N-type epitaxial layer grown over the substrate and pockets of the epitaxial layer defined and isolated electrically from each other by a P-type isolation wall.

Such a pocket is represented by line 21. Pocket 21 contains a group of P-type diffused regions that form resistors including resistors 22 and 24. Other such pockets contain diodes 26 and 28, transistors 31, 32, 33, 34, 35, 36, 37 and 38, and the zener diode 41. Resistors 43 and 45 represent thin films of doped polysilicon formed over a conventional glass layer overlying the surface of the semiconductor die. A further description of and method of making integrated circuits having diffused components is silicon with a glass protective layer thereover and polysilicon resistors is found in the U.S. Pat. No. 4,225,877, issued Sept. 30, 1980 and assigned to the same assignee as is the present invention. This patent accordingly is incorporated herein by reference.

Having formed the registered composite stack 20, it may now be observed which elements of which components require interconnection to form a particular circuit. Normally such interconnections are decided upon at the outset and are provided for by the draftsman in his original precision drawing, leading directly to complete metallization artwork that includes interconnections in the RUBYLITH.

Figure 3:
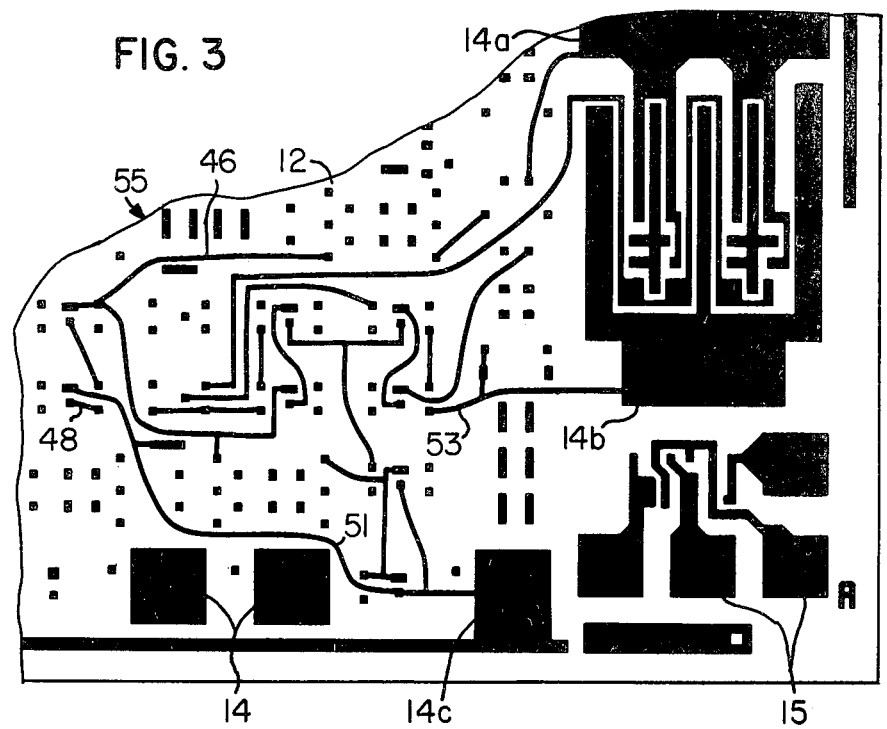
FIG. 3 shows a photograph of the completed metallization artwork of this invention.

According to the method of the present invention the artwork 10 of FIG. 1 is completed while in the composite stack 20 by applying strips of an opaque adhesive tape, or the like. For example, such a piece of tape 46 will lead to the metal interconnection of the collector of transistor 28 and the left most end of polysilicon resistor 43. A double diffused NPN transistor has emitter and collector elements shorted together via tape piece 48 to form the zener diode 41. Tape piece 51 effects connection between the anode of zener diode 41 and the ground terminal pad 14c. the collector of transistor 32 is connected to the input terminal pad 14b via tape piece 53. After all of the taping is completed, the finished product is a completed metallization artwork 55 as shown in FIG. 3, having been separated from the composite stack 20.

Figure 4:
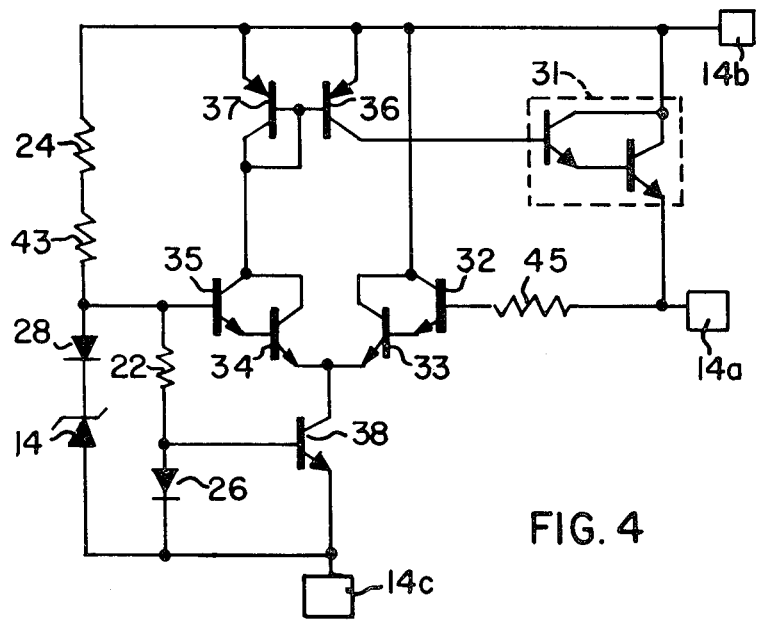
FIG. 4 shows a circuit diagram of the integrated circuit represented by the artwork and composite drawing of FIG. 2.

The particular circuit formed by the taping step, is shown diagrammatically in FIG. 4. From FIGS. 2 and 4 it can be seen that the power transistor 31 is a composite transistor made up of a Darlington pair. The circuit is a voltage regulator circuit providing between ouput terminal pad 14a and the ground pad 14c a regulated positive voltage, an unregulated +DC voltage source (not shown) being connected between input pad 14b and ground pad 14c.

The integrated circuit die only partially represented in FIG. 2 includes two power transistors, 50 transistor/diodes, 31 diffused resistors and 29 polysilicon resistors for which only metal patch contact with the component elements is provided in the above noted partially completed artwork intended to be stored. The die measures 0.089 by 0.104 inches (2.26 by 2.64 mms) and includes in addition the separate test circuit 16. It further includes a protection diode, e.g. 57, associated with most of the seventeen principal terminal pads, e.g. pads 14, some of which are not shown. The customer, in the above described procedure, may connect the diode 57 to an adjacent principal terminal pad (e.g. by taping) to provide protection against static charge damage to his insulated polysilicon resistors during handling in manufacturing and later by the customer in assembly. Such a protection system is described in the copending application Ser. No. 221,084 filed Dec. 29, 1980 and assigned to the same assignee as is the present invention.

This invention is believed to make possible a greater participation by a customer circuit design engineer in the choices and tradeoffs in circuit implementation, layout and experimentation that heretofore have been perforce essentially the sole province of the integrated circuit manufacturer.

What is claimed is:

1. Artwork for making a metallizing mask by which a metal film system for contacting the components of a custom integrated circuit may be made by standard metallization photolithographic and selective etch processes comprising:

a transparent sheet;

separate patches of an opaque cut-and-strip type film adhered to said sheet, one group of said separate patches being at locations, respectively, corresponding to contact areas of said components, another group of said separate patches corresponding to terminal pads for said integrated circuit;

opaque strips adhered to said sheet, said strips overlapping and connecting said patches to effect the necessary interconnection between said components and terminal pads and thus to form a functional principal circuit portion of said integrated circuit; and islands of said opaque cut-and-strip type film that are adapted to completely form terminal pads and interconnecting metal to a special group of said components that together constitutes a separate test circuit portion of said integrated circuit.

2. Method for preparing artwork for use in making a metallizing mask by which a metal film system for contacting the components of a custom integrated circuit may be made by standard metallization photolithographic and selective etch processes comprising:

(a) forming on a transparent sheet separate patches of an opaque cut-and-strip type film, one group of said separate patches being at locations, respectively, corresponding to contact areas of said components, another group of said separate patches corresponding to terminal pads for said integrated circuit, and islands of said opaque cut-and-strip type film adapted to completely form terminal pads and interconnecting metal to a special group of said components that together constitutes a separate test circuit portion of said integrated circuit; and (b) adhering opaque strips to said sheet to overlap and connect said patches to effect the necessary interconnection between said components and terminal pads that lead to the formation of a functional principal circuit portion of said integrated circuit.

* * * * *